(12) United States Patent
Hieda

(10) Patent No.: US 7,253,075 B2
(45) Date of Patent: Aug. 7, 2007

(54) SEMICONDUCTOR DEVICE AND METHOD FOR MANUFACTURING THE SAME

(75) Inventor: Katsuhiko Hieda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 293 days.

(21) Appl. No.: 10/886,667

(22) Filed: Jul. 9, 2004

(65) Prior Publication Data

US 2004/0248359 A1 Dec. 9, 2004

Related U.S. Application Data

(62) Division of application No. 10/368,642, filed on Feb. 20, 2003, now Pat. No. 6,777,776.

(30) Foreign Application Priority Data

Oct. 28, 2002 (JP) .............................. 2002-313049

(51) Int. Cl.
*H01L 21/20* (2006.01)
(52) U.S. Cl. .................. 438/393; 438/240; 438/396
(58) Field of Classification Search .................. 438/3, 438/240, 253, 396, 250, 393
See application file for complete search history.

(56) References Cited

U.S. PATENT DOCUMENTS

| 4,458,295 A | 7/1984 | Durschlag et al. |
|---|---|---|
| 5,959,829 A | 9/1999 | Stevenson et al. |
| 6,162,649 A * | 12/2000 | Kweon et al. .................. 438/3 |
| 6,230,566 B1 | 5/2001 | Lee et al. |
| 6,465,320 B1 | 10/2002 | McNeil et al. |
| 6,486,523 B2 | 11/2002 | Tomomatsu |
| 2002/0021561 A1 | 2/2002 | Yamauchi et al. |
| 2002/0056869 A1* | 5/2002 | Morimoto .................... 257/313 |
| 2002/0075098 A1 | 6/2002 | Khuri-Yakub et al. |
| 2003/0186569 A1 | 10/2003 | Suzuki et al. |
| 2004/0046203 A1* | 3/2004 | Morimoto .................... 257/303 |

FOREIGN PATENT DOCUMENTS

JP 9-321227 12/1997

(Continued)

OTHER PUBLICATIONS

Notification of Reasons for Rejection, issued by Japanese Patent Office, mailed Mar. 22, 2005, in Japanese Patent Application No. 2002-313049, and English-language translation thereof.

(Continued)

*Primary Examiner*—Mary Wilczewski
*Assistant Examiner*—Toniae M. Thomas
(74) *Attorney, Agent, or Firm*—Finnegan, Henderson, Farabow, Garrett & Dunner, L.L.P.

(57) ABSTRACT

A semiconductor device has a plurality of capacitors. The semiconductor device includes a first capacitor arranged on a substrate and including first upper and lower electrode layers between which a first capacitor insulation film is interposed, and a second capacitor arranged on the substrate and including second upper and lower electrode layers between which a second capacitor insulation film is interposed, the second upper and lower electrode layers having a same structure as that of the first upper and lower electrode layers, and the second capacitor having a per-unit-area capacity different from that of the first capacitor.

18 Claims, 7 Drawing Sheets

FOREIGN PATENT DOCUMENTS

| | | |
|---|---|---|
| JP | 11-145387 | 5/1999 |
| JP | 2000-208719 | 7/2000 |
| JP | 2001-177057 | 6/2001 |
| JP | 2001-274340 | 10/2001 |
| JP | 2002-57291 | 2/2002 |
| WO | WO 01/54199 A1 | 7/2001 |

OTHER PUBLICATIONS

First Notification of Reasons for Rejection, dated Apr. 29, 2005, issued by the Chinese Patent Office in a counterpart Chinese application.

* cited by examiner

Capacitor section A     Capacitor section B

SEMICONDUCTOR DEVICE AND METHOD FOR MANUFACTURING THE SAME

CROSS-REFERENCE TO RELATED APPLICATIONS

This is a division of application Ser. No. 10/368,642, filed Feb. 20, 2003 now U.S. Pat. No. 6,777,776, which is incorporated in its entirety herein by reference. This application is also based upon and claims priority from prior Japanese Patent Application No. 2002-313049, filed Oct. 28, 2002, the entire contents of which are incorporated herein by reference.

BACKGROUND OF THE INVENTION

1. Field of the Invention

The present invention relates to a semiconductor device that includes a plurality of capacitors having different capacities. More specifically, the invention relates to a semiconductor device that includes an improved RF (radio frequency) capacitor having an MIM (metal-insulator-metal) structure.

2. Description of the Related Art

RF MIM capacitors are elements essential for embedding an analog circuit and a digital CMOS circuit on a single chip. Recently, it has been proposed to use a high dielectric film, such as a $Ta_2O_5$ film, as a capacitor insulation film in order to reduce the area of the occupation of MIM capacitors (Jpn. Pat. Appln. KOKAI Publication No. 2001-177057).

The high dielectric MIM capacitor using a $Ta_2O_5$ film or the like has the same capacity as that of a conventional one though its area is small, whereas it has a drawback of increasing a leakage current. This drawback is caused for the following reason. Because of oxidation of the surface of a lower electrode and reaction with the material thereof at the time of formation of a $Ta_2O_5$ film, oxygen deficiencies due to a plasma atmosphere at the time of formation of an upper electrode, and the like, a leakage current flowing through the $Ta_2O_5$ film becomes difficult to control.

Some capacitors used for a semiconductor device require a large capacity, and others do a small leakage current rather than a large capacity. It is thus likely that when $Ta_2O_5$ is used in a capacitor insulation film, it will not meet the requirement that the leakage current should be small. The above-described problem will be solved if a capacitor using high dielectric materials and a capacitor having a small leakage current are manufactured separately from each other; however, manufacturing costs for the device will increase remarkably.

The use of a capacitor insulation film having a high dielectric constant has conventionally been considered in order to reduce the area of capacitors. Since, however, such a capacitor insulation film increases a leakage current, it is inapplicable to a capacitor that requires a small leakage current. Moreover, the separate manufacturing of a capacitor using high dielectric materials and a capacitor having a small leakage current causes an upswing in manufacturing costs.

BRIEF SUMMARY OF THE INVENTION

According to an aspect of the present invention, there is provided a semiconductor device including a plurality of capacitors, comprising:

a first capacitor arranged on a substrate and including first upper and lower electrode layers between which a first capacitor insulation film is interposed; and a second capacitor arranged on the substrate and including second upper and lower electrode layers between which a second capacitor insulation film is interposed, the second upper and lower electrode layers having a same structure as that of the first upper and lower electrode layers, and the second capacitor having a per-unit-area capacity different from that of the first capacitor.

According to another aspect of the present invention, there is provided a method of manufacturing a semiconductor device including a plurality of capacitors, comprising:

forming a lower conductive film on a semiconductor substrate, the lower conductive film serving as a lower electrode;

forming a capacitor insulation film on the lower conductive film, the capacitor insulation film including one of a single layer and a multilayer dielectric layer and partly varying in one of material and structure;

forming an upper conductive film on the capacitor insulation film, the upper conductive film serving as an upper electrode;

forming a lower electrode by etching the upper conductive film and then the lower conductive film into a lower electrode pattern; and forming an upper electrode by etching the upper conductive film into an upper electrode pattern.

DETAILED DESCRIPTION OF THE INVENTION

Embodiments of the present invention will now be described in detail with reference to the accompanying drawings.

An object of the embodiments is to provide an MIM capacitor configuration that is suitably used for an RF circuit and capable of achieving both a reduction in the area of a capacitor using high dielectric materials and a decrease in the leakage current thereof without increasing in manufacturing costs.

First Embodiment

Figure 1:
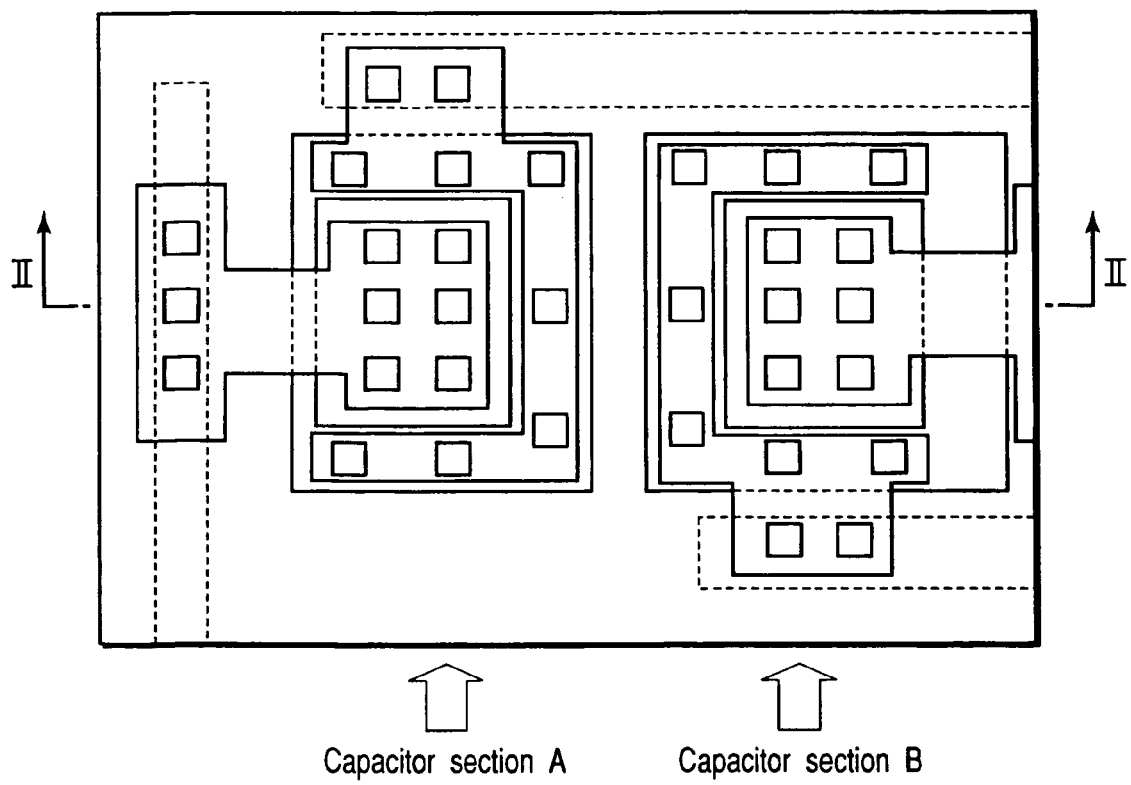
FIG. 1 is a schematic plan view of a configuration of a capacitor according to a first embodiment of the present invention.
Figure 2:
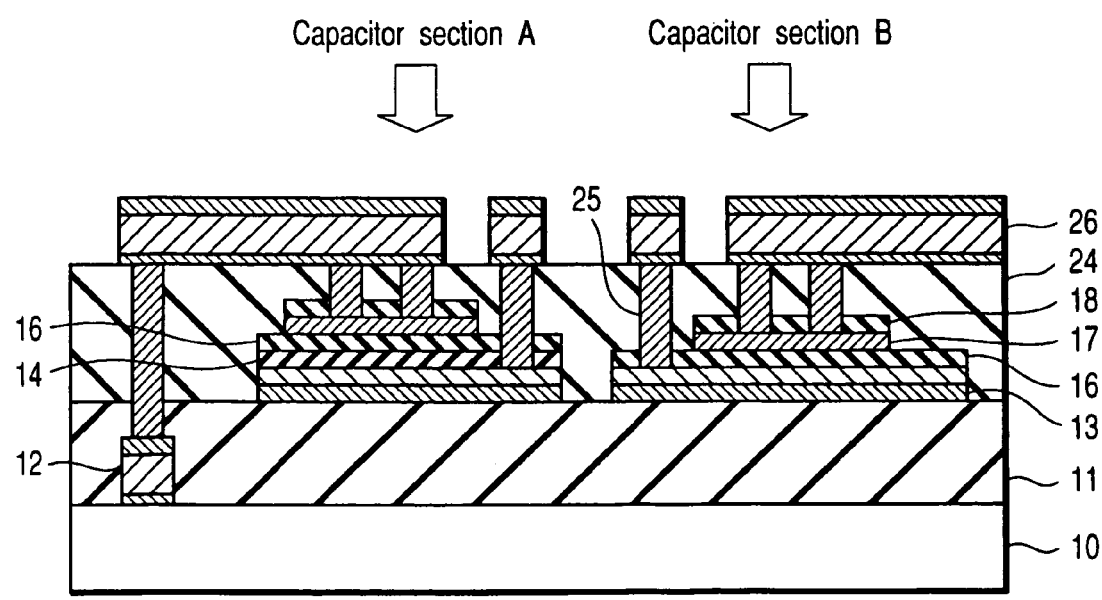
FIG. 2 is a schematic cross-sectional view of the configuration of the capacitor according to the first embodiment.

FIGS. 1 and 2 are schematic views for explanation of a configuration of an MIM capacitor according to a first embodiment of the present invention. FIG. 1 is a plan view of MIM capacitor sections and FIG. 2 is a cross-sectional view taken along line II-II. However, a multilayer interconnection layer that is formed under the capacitor sections is omitted from the figures.

Actually, a number of capacitor sections are formed on a single substrate though FIGS. 1 and 2 show only two.

In FIG. 2, reference numeral 10 denotes a substrate having a multilayer interconnection. A wiring layer 12 is formed on the substrate 10. A $SiO_2$ film (referred to as a P—$SiO_2$ film hereinafter) 11 is deposited on the substrate 10 by plasma CVD so as to cover the wiring layer 12. A plurality of capacitor sections are formed on the P—$SiO_2$ film 11 and each made up of a TiN/Ti lower electrode 13 and a TiN upper electrode 17 between which a capacitor insulation film is interposed. The capacitor insulation film of a capacitor section A (first group) has a multilayer structure including a SiN film 14 serving as a first dielectric layer and a $Ta_2O_5$ film 16 serving as a second dielectric layer. The capacitor insulation film of a capacitor section B (second group) is a $Ta_2O_5$ film 16 serving as a second dielectric layer.

A P—$SiO_2$ film 24 is formed on the P—$SiO_2$ film 11 so as to cover the capacitor sections. The P—$SiO_2$ film 24 has contact holes to contact with the electrodes. A metal plug 25 is buried into each of the contact holes. A wiring layer 26 such as TiN, Ti and Al is formed on the P—$SiO_2$ film 24.

The MIM capacitor according to the first embodiment has basically the same configuration as that of the prior art MIM capacitor except for the materials of the electrodes and the composition of the capacitor dielectric films. The following is a difference between the MIM capacitor of the first embodiment and the prior art MIM capacitor.

First, an MIM capacitor that requires a small leakage current has a configuration in which a capacitor insulation film is formed in a lower electrode interface to suppress a leakage current. This configuration allows the MIM capacitor (capacitor section A) to decrease in leakage current. On the other hand, an MIM capacitor that needs to decrease in area is made of materials whose dielectric constant is greater than that of a prior art capacitor insulation film, such as $Ta_2O_5$. This configuration allows the MIM capacitor (capacitor section B) to decrease in area. If these two capacitor sections having different characteristics are formed at once using the upper and lower electrodes having the same structure, process costs can be prevented from increasing.

A method of forming the MIM capacitor sections A and B simultaneously will now be described. FIGS. 3A to 3E are cross-sectional views corresponding to that of FIG. 2. These figures show an MIM capacitor including only two capacitor sections A and B. Using a capacitor that differs in area, the number of capacitor sections, or the type of interlayer insulation film formed therein, the same process as below is executed.

Figure 3A:
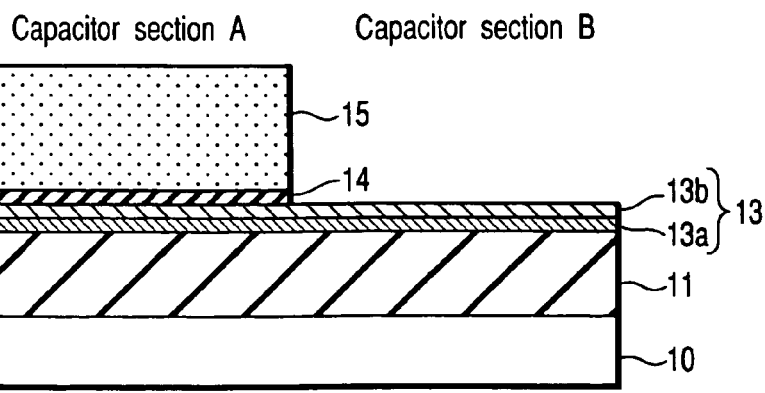
FIGS. 3A to 3E are cross-sectional views showing a process of manufacturing the capacitor according to the first embodiment.

Referring first to FIG. 3A, a $SiO_2$ film 11 is deposited on a lower substrate 10 including a multilayer interconnection by, e.g., plasma CVD. After that, the $SiO_2$ film 11 is flattened by CMP. Then, a Ti film 13a and a TiN film 13b each serving as a lower electrode 13 of the capacitor are formed by, e.g., sputtering. The thickness of the Ti film 13a is set to, e.g., 40 nm and that of the TiN film 13b is set to, e.g., 60 nm.

Other film forming methods such as CVD and coating can be used; however, since a wiring layer has already been formed under the capacitor, film-forming temperature is subjected to restrictions. More specifically, the film-forming temperature of 400° C. or lower is desirable. Since, moreover, an interface is formed between the TiN film 13b and the capacitor insulation film, if Ti particles remain on the surface of the TiN film 13b, $TiO_x$ will be easily formed. This is not desirable. It is thus preferable to perform low-temperature plasma nitriding in an atmosphere of, e.g., $NH_3$ (ammonia) and perform annealing at about 400° C. in an atmosphere of $H_2/N_2$ as surface treatment of the TiN film 13b. Other types of surface treatment proposed so far can also be performed.

Subsequently, a nitride film is formed as a first-layer capacitor insulation film on the whole surface of the resultant structure in a plasma atmosphere. Specifically, a P—SiN film 14 having a thickness of about 30 nm is formed on the lower electrode 13. A desirable temperature at which the P—SiN film 14 is formed ranges from 350° C. to 370° C. Then, a resist mask 15 is formed by normal lithography to cover the capacitor section A with resist and expose the capacitor section B. After that, the P—SiN film 14 is selectively removed from the capacitor section B by normal wet or dry etching. Though the SiN film 14 is formed by plasma-CVD in this process, it may be formed of the SiN film which doesn't contain deoxidization such as hydrogen in the film by sputtering.

Figure 3B:
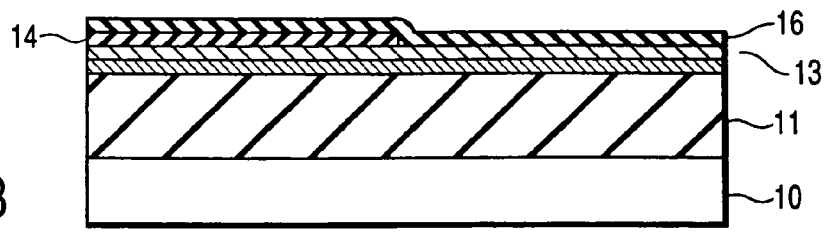

Referring to FIG. 3B, the resist mask 15 is removed and then, for example, a $Ta_2O_5$ film 16 having a thickness of about 40 nm is formed on the entire surface of the resultant structure as a second-layer capacitor insulation film. Sputtering, CVD, coating (spin on dielectric), etc. can be used to form the $Ta_2O_5$ film 16. As is well known, the impurities (e.g., carbon) in the $Ta_2O_5$ film 16 can be reduced by performing heat treatment at about 370° C. in an atmosphere of ozone ($O_3$) after the $Ta_2O_5$ film 16 is formed. Furthermore, the $Ta_2O_5$ film 16 can be formed through a plurality of steps.

Figure 3C:
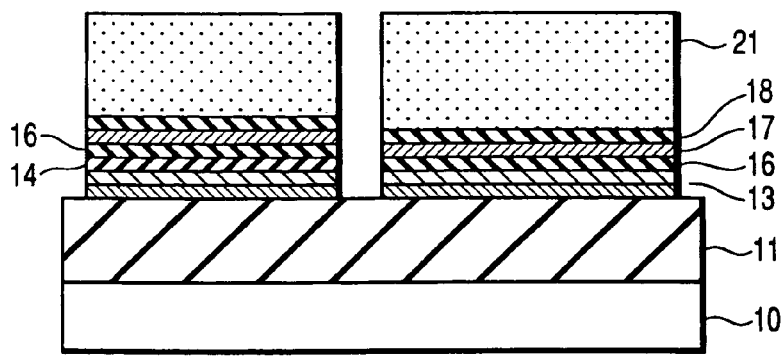

As illustrated in FIG. 3C, a TiN film 17 having a thickness of about 50 nm, which serves as an upper electrode layer, is deposited on the whole surface of the resultant structure by, e.g., sputtering. After that, process damage to the capacitor insulation film at the time of formation of the electrodes can be recovered by performing heat treatment in an atmosphere of nitrogen or an atmosphere of $H_2/N_2$ at a temperature ranging from 350° C. to 400° C. Then, a P—SiN film or sputter SiN film 18 having a thickness of about 50 nm is deposited for patterning of the resultant structure. Subsequently, a resist mask 21 is formed by normal lithography and the SiN film 18 is selectively etched by dry etching such as RIE. After that, the resist film 21 is removed and then the TiN film 17, Ta$_2$O$_5$ film 16, SiN film 14, and N and Ti films 13b and 13a of lower electrodes are patterned in order using the SiN film as a mask. At this time, etching gas, atmosphere, and the like are sequentially varied according to the materials of a film to be etched.

Figure 3D:
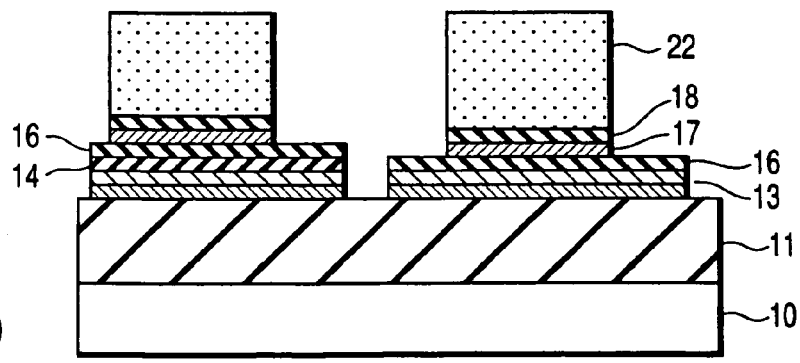

Referring to FIG. 3D, a resist mask 22 is formed by normal lithography in order to process the upper electrode. Then, the SiN film 18 is selectively etched by dry etching such as RIE. After the resist mask 22 is removed, the TiN film 17 serving as the upper electrode is etched using the SiN film 18 as a mask. The etching of the TiN film 17 is stopped when it reaches the Ta$_2$O$_5$ film 16 of a capacitor insulation film. In other words, the etching is stopped if the capacitor insulation film 16 is slightly etched.

Figure 3E:
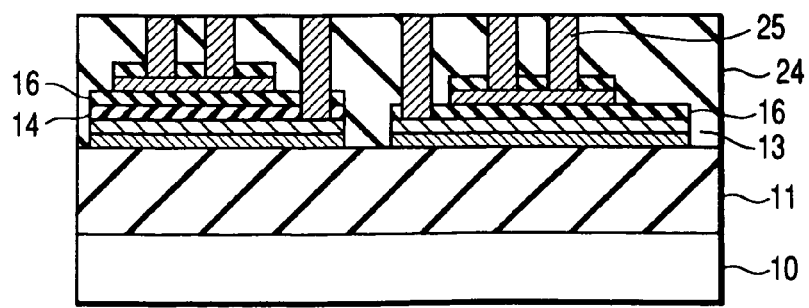

As shown in FIG. 3E, for example, a plasma SiO$_2$ film and a coating film are deposited on the entire surface of the resultant structure as an interlayer insulation film 24. Then, the interlayer insulation film 24 is flattened by, e.g., CMP when the need arises. Thereafter, a contact hole that is electrically connected to the upper and lower electrode layers or a lower electrode layer for interconnection is formed by normal lithography and dry etching. After that, a metal plug 25 is buried in the contact hole.

After that, as shown in FIG. 2, a wiring layer 26 necessary for the upper and lower electrode layers 13 and 17 is formed. Though the wiring layer 26 has a multilayer structure of TiN/Ti/Al—Cu/TiN/Ti, it is not limited to the multilayer structure but can be formed of Cu or the like. After that, though not shown, P—SiO$_2$ and P—SiN layers are deposited for passivation and a pad hole is formed in a desired area, thereby completing a semiconductor device having an MIM capacitor above the wiring layer.

The density (fF/µm$^2$) of the MIM capacitor (Ta$_2$O$_5$ film: 40 nm, SiN film: 30 nm) is as follows:

Capacitor section A (TiN/Ta$_2$O$_5$/SiN/TiN): 1.58 fF/µm$^2$
Capacitor section B (TiN/Ta$_2$O$_5$/TiN): 5.53 fF/µm$^2$ In this example, the Ta$_2$O$_5$ film is shown as a high dielectric film (high-K) different from the SiN film. However, other high-K films such as a (Ba, Sr) TiO$_3$ film, a SrTiO$_3$, a HfO$_2$ film, a ZrO$_2$ film, an Al$_2$O$_3$ film, a Ta$_2$O$_5$ film contains Nb oxide, or a Ta$_2$O$_5$ film contains Ti oxide, or can be used. The use of such a film having a great dielectric constant increases a higher density. Moreover, an Al$_2$O$_3$ film can be used in place of the SiN film. Though the TiN film is used as an electrode, a precious-metal conductive film such as a Ru film, a RuO$_2$ film, a TiON film, a Pt film, a Re film, an Ir film, an IrO$_2$ film, an Os film, a Pd film, a Rh film, a Au film, a Ni film, a Cu film, and a film which contains Ta like a Ta film and a TaN film can be used in place of the TiN film. Furthermore, a metal oxide film of the precious-metal conductive film and a perovskite metal oxide film such as SRO (strontium ruthenium oxide) can be used.

The point of the first embodiment lies in an MIM capacitor including upper and lower electrodes whose capacitor insulation structures differ from each other. Adopting a structure that is capable of simultaneously forming a capacitor section A (TiN/Ta$_2$O$_5$/SiN/TiN) requiring a small leakage current and a capacitor section B (TiN/Ta$_2$O$_5$/TiN) requiring a high density as shown in FIGS. 1 and 2, the following advantages are obtained:

(1) The leakage current of the MIM capacitor (capacitor section A) can be decreased by inserting a capacitor insulation film that is capable of suppressing a leakage current.

(2) The area of the MIM capacitor (capacitor section B) can be decreased using a high dielectric film for a capacitor insulation film.

(3) The above two capacitor sections A and B having different characteristics are simultaneously formed using upper and lower electrodes having the same structure. This capacitor structure allows the process costs to lower.

FIGS. 3A to 3E show an example in which the lower electrode is first processed and then the upper electrode is processed. This order can be reversed. Specifically, after the step shown in FIG. 3B, the TiN film 17 having a thickness of about 50 nm, which serves as the upper electrode layer, is deposited on the whole surface of the resultant structure by, e.g., sputtering. After that, process damage to the capacitor insulation film at the time of formation of the electrodes can be recovered by performing heat treatment in an atmosphere of nitrogen or H$_2$/N$_2$ at a temperature ranging from about 350° C. to 400° C. This step can be omitted. Then, a SiN film 18 having a thickness of about 50 nm is deposited for patterning. It is desirable to use a deposition method that does not cause any reducing atmosphere, such as sputtering, in order to form the SiN film 18.

Figure 4A:
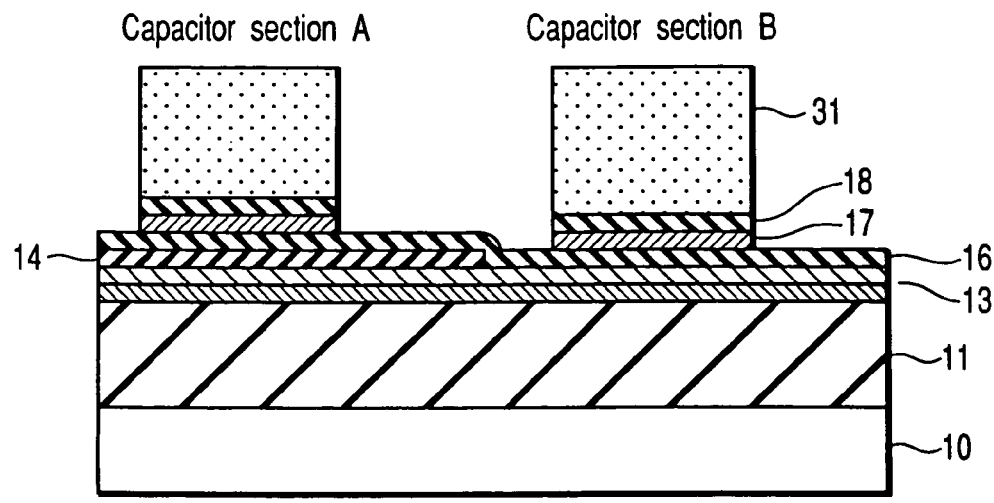
FIGS. 4A and 4B are cross-sectional views showing another process of manufacturing the capacitor according to the first embodiment.

As shown in FIG. 4A, a resist mask 31 for the upper electrode is formed by normal lithography, and a SiN film 18 is selectively etched by dry etching such as RIE. After that, the resist film 31 is removed and then the TiN film 17 is etched by, e.g., RIE using the SiN film 18 as a mask, thus forming a pattern of the upper electrode. At this time, a condition for preventing the Ta$_2$O$_5$ film 16 and SiN film 14, each of which serves as a capacitor insulation film, from being etched as much as possible is selected. Consequently, a leakage current due to an electric field leaking from the edge of the upper electrode and a residue of etching can be prevented from increasing.

Figure 4B:
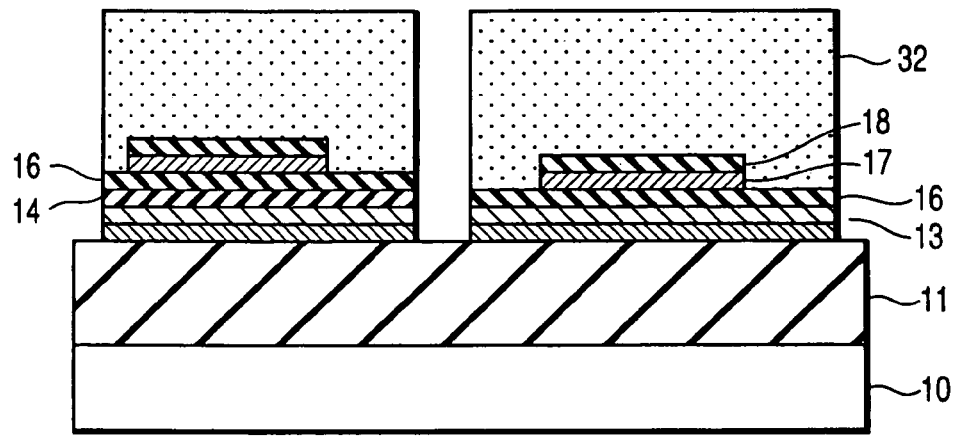

As illustrated in FIG. 4B, after the resist-mask 31 is removed, a resist mask 32 is formed by normal lithography to process the lower electrode. Then, the Ta$_2$O$_5$ film 16 and SiN film 14 are selectively etched by dry etching such as RIE. The TiN film 13 serving as a lower electrode is also selectively etched. In most cases, the lower electrode 13 is used as a multilayer electrode including a TiN film having a thickness of about 50 nm and a Ti film having a thickness of about 150 nm formed under the TiN film. The lower electrode 13 is formed by etching the multilayer electrode of TiN/Ti by RIE or the like. After that, the resist film is removed and the processing of the lower electrode is completed.

Even in the foregoing manufacturing process, the configuration of the capacitor to be finally manufactured is equal to that of the capacitor shown in FIGS. 1 and 2, and the same advantages as those of the capacitor manufactured in the manufacturing steps shown in FIGS. 3A to 3E are obtained.

According to the first embodiment described above, a capacitor insulation film capable of suppressing a leakage current is used in a capacitor region that requires a small leakage current, and a capacitor insulation film that is made of materials whose dielectric constant is greater than that of the prior art capacitor insulation film is used in an MIM capacitor that needs to decrease in area. Thus, both the MIM capacitor (capacitor section A) whose leakage current is small and the MIM capacitor (capacitor section B) whose area is small can be achieved. In this case, the two capacitors having different characteristics are simultaneously formed using upper and lower electrodes having the same structure, thereby preventing process costs from rising.

In other words, both a reduction in the area of a capacitor using high dielectric materials and a decrease in the leakage current thereof can be achieved without increasing manufacturing costs. Therefore, an MIM capacitor having a structure suitable for an RF circuit and the like can be achieved.

Second Embodiment

Figure 5:
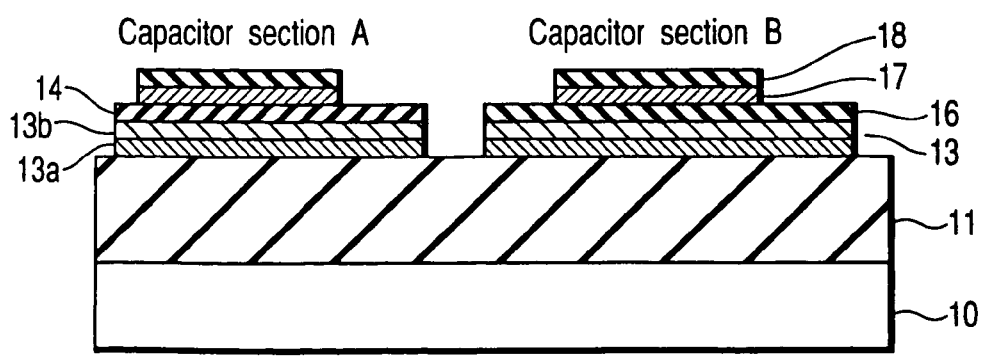
FIG. 5 is a schematic cross-sectional view of a configuration of a capacitor according to a second embodiment of the present invention.

FIG. 5 is a cross-sectional view schematically showing a configuration of upper and lower electrodes and that of capacitor insulation films in an MIM capacitor according to a second embodiment of the present invention. The same components as those of FIG. 2 are denoted by the same reference numerals and their detailed descriptions are omitted.

The second embodiment differs from the first embodiment only in the structure of the capacitor insulation films in capacitor sections A and B. The steps of processing the upper and lower electrodes and forming an interlayer insulation film, a contact, a wiring layer, etc. are the same as those in the first embodiment. The second embodiment will now be described with reference to FIG. 5.

Referring to FIG. 5, the capacitor insulation film in the capacitor section A is a SiN film 14 and that in the capacitor section B is a $Ta_2O_5$ film 16. The configuration of the second embodiment can be achieved by depositing the $Ta_2O_5$ film 16 on the entire surface in the step of FIG. 3B in the first embodiment and then removing the film 16 from the capacitor section A by normal lithography and etching.

In the second embodiment, the number of steps is increased by the lithography and etching steps but the density of the capacitor section A can be improved more than that in the first embodiment.

The density of the MIM capacitor ($Ta_2O_5$ film: 40 nm, SiN film: 30 nm) is as follows:

Capacitor section A (TiN/SiN/TiN): 2.21 $fF/\mu m^2$
Capacitor section B (TiN/$Ta_2O_5$/TiN): 5.53 $fF/\mu m^2$ Therefore, the same advantages as described in the above paragraphs (1) to (3) can be obtained from the second embodiment, too.

Third Embodiment

Figure 6:
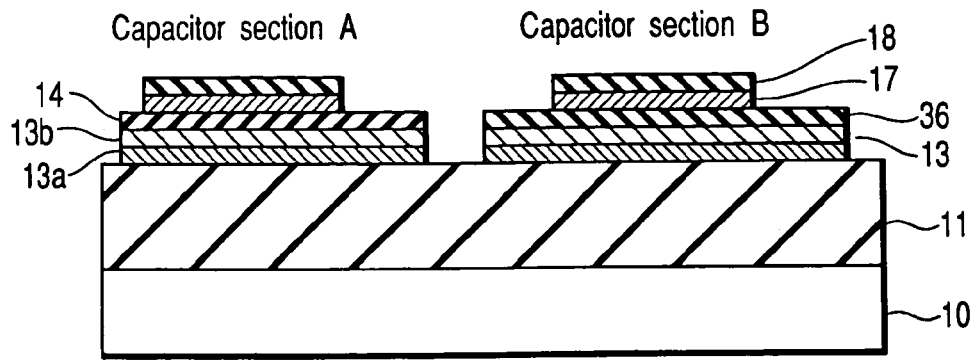
FIG. 6 is a schematic cross-sectional view of a configuration of a capacitor according to a third embodiment of the present invention.

FIG. 6 is a cross-sectional view schematically showing a configuration of upper and lower electrodes and that of capacitor insulation films in an MIM capacitor according to a third embodiment of the present invention. The same components as those of FIG. 2 are denoted by the same reference numerals and their detailed descriptions are omitted.

The third embodiment differs from the first embodiment in the structure of the capacitor insulation films in capacitor sections A and B. The steps of processing the upper and lower electrodes and forming an interlayer insulation film, a contact, a wiring layer, etc. are the same as those in the first embodiment. The third embodiment will now be described with reference to FIG. 6.

As illustrated in FIG. 6, the capacitor insulation film in the capacitor section A is a SiN film 14 having a thickness of, e.g., 30 nm and that in the capacitor section B is a (Ba, Sr) $TiO_3$ film 36 having a thickness of, e.g., 40 nm.

The configuration of the third embodiment can be achieved by depositing the (Ba, Sr) $TiO_3$ film 36 on the entire surface in place of the $Ta_2O_5$ film 16 in the step of FIG. 3B in the first embodiment and then removing the film 36 from the capacitor section A by normal lithography and etching.

In the third embodiment, the number of steps is increased by the lithography and etching steps but the leakage current of the capacitor section A can be decreased and the capacity-to-voltage linearity thereof can be improved more than that in the first embodiment. On the other hand, the density per unit area (capacitor density: $fF/\mu m^2$) in the capacitor section B can be increased and thus the capacitor forming area can be decreased.

The density of the MIM capacitor ($TiO_3$ film: 40 nm, SiN film: 30 nm) is as follows:

Capacitor section A (TiN/SiN/TiN): 2.21 $fF/\mu m^2$
Capacitor section B (TiN/(Ba,Sr)$TiO_3$/TiN): 33.18 $fF/\mu m^2$ In the third embodiment, the (Ba,Sr)$TiO_3$ is used as a high dielectric (high-K) film. However, other films such as a $SrTiO_3$ film can be used as a high-K film. The density of the MIM capacitor ($SrTiO_3$ film: 40 nm, SiN film: 30 nm) is as follows:

Capacitor section A (TiN/SiN/TiN): 2.21 $fF/\mu m^2$
Capacitor section B (TiN/$SrTiO_3$/TiN): 16.59 $fF/\mu m^2$ Therefore, the same advantages as described in the above paragraphs (1) to (3) can be obtained from the third embodiment, too.

Fourth Embodiment

Figure 7:
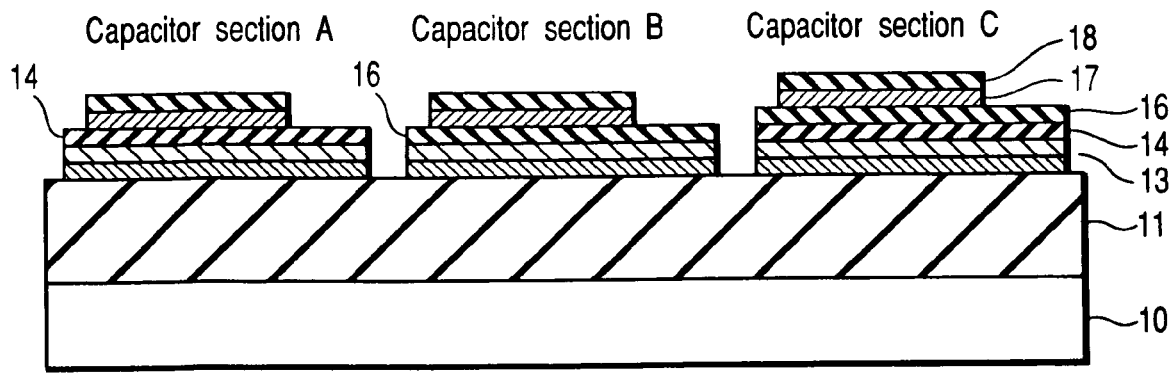
FIG. 7 is a schematic cross-sectional view of a configuration of a capacitor according to a fourth embodiment of the present invention.

FIG. 7 is a cross-sectional view schematically showing a configuration of upper and lower electrodes and that of capacitor insulation films in an MIM capacitor according to a fourth embodiment of the present invention. The same components as those of FIG. 2 are denoted by the same reference numerals and their detailed descriptions are omitted.

The fourth embodiment differs from the first and second embodiments in that a capacitor section C having a different capacitor insulation film is provided in addition to the capacitor sections A and B. The steps of processing the upper and lower electrodes and forming an interlayer insulation film, a contact, a wiring layer, etc. are the same as those in the first embodiment. The fourth embodiment will now be described with reference to FIG. 7.

As shown in FIG. 7, the capacitor insulation film in the capacitor section A is a SiN film 14, that in the capacitor section B is a $Ta_2O_5$ film 16, and that in the capacitor section C is a multilayer film including a $Ta_2O_5$ film and a SiN film.

In the fourth embodiment, the SiN film 14 is deposited on the entire surface of the structure in the same step as that of FIG. 3A in the first embodiment and then the SiN film 14 is selectively removed only from the capacitor section B by normal lithography and etching, thereby leaving the SiN film 14 in the capacitor sections A and C. After that, the $Ta_2O_5$ film 16 is deposited on the entire surface of the resultant structure in the same step as that of FIG. 3B and then the $Ta_2O_5$ film 16 is removed only from the capacitor section A by normal lithography and etching, thereby leaving the $Ta_2O_5$ film 16 in the capacitor sections B and C.

In the fourth embodiment, the number of steps is increased by the lithography and etching steps as compared with the first embodiment. However, the capacitor section C can be achieved in addition to the capacitor sections A and B.

The density of the MIM capacitor ($Ta_2O_5$ film: 40 nm, SiN film: 30 nm) is as follows:

Capacitor section A (TiN/SiN/TiN): 2.21 $fF/\mu m^2$
Capacitor section B (TiN/$Ta_2O_5$/TiN): 5.53 $fF/\mu m^2$
Capacitor section C (TiN/$Ta_2O_5$/Sin/TiN): 1.58 $fF/\mu m^2$ The leakage current can be decreased by both the capacitor sections A and C having different densities.

Therefore, the same advantages as described in the above paragraphs (1) to (3) can be obtained from the fourth embodiment, too.

Fifth Embodiment

Figure 8:
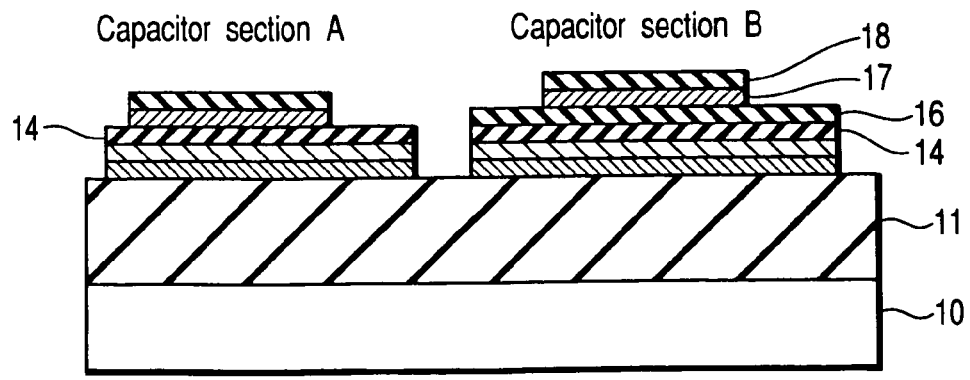
FIG. 8 is a schematic cross-sectional view of a configuration of a capacitor according to a fifth embodiment of the present invention.

FIG. 8 is a cross-sectional view schematically showing a configuration of upper and lower electrodes and that of capacitor insulation films in an MIM capacitor according to a fifth embodiment of the present invention. The same components as those of FIG. 2 are denoted by the same reference numerals and their detailed descriptions are omitted.

The fifth embodiment differs from the first and second embodiments in the structure of the capacitor insulation films in capacitor sections A and B. The steps of processing the upper and lower electrodes and forming an interlayer insulation film, a contact, a wiring layer, etc. are the same as those in the first embodiment. The fifth embodiment will now be described with reference to FIG. 8.

Referring to FIG. 8, the capacitor insulation film in the capacitor section A includes a SiN film 14 and that in the capacitor section B includes a $Ta_2O_5$ film and a SiN film. The configuration of the fifth embodiment can be achieved by depositing the $Ta_2O_5$ film 16 on the entire surface without selectively etching the SiN film 14 in the step of FIG. 3A in the first embodiment and then removing the film 16 from the capacitor section A by normal lithography and etching.

In the fifth embodiment, the number of steps is increased by the lithography and etching steps but the leakage current of the capacitor section B can be decreased more than that in the first embodiment.

The density of the MIM capacitor ($Ta_2O_5$ film: 20 nm, SiN film: 20 nm) is as follows:
Capacitor section A (TiN/SiN/TiN): 3.23 fF/$\mu m^2$
Capacitor section B (TiN/$Ta_2O_5$/SiN/TiN): 2.55 fF/$\mu m^2$ The capacitor section A can be used for a capacitor that decreases a voltage (e.g., 2.0 V or lower) and suppresses a leakage current, and the capacitor section B can be used for a capacitor that operates at a high voltage (e.g., 2.0 V or higher).

Therefore, the same advantages as described in the above paragraphs (1) to (3) can be obtained from the fifth embodiment, too.

Sixth Embodiment

Figure 9:
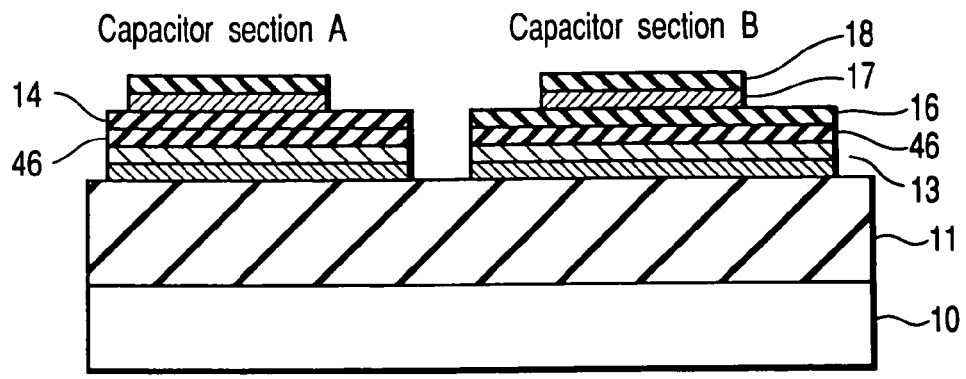
FIG. 9 is a schematic cross-sectional view of a configuration of a capacitor according to a sixth embodiment of the present invention.

FIG. 9 is a cross-sectional view schematically showing a configuration of upper and lower electrodes and that of capacitor insulation films in an MIM capacitor according to a sixth embodiment of the present invention. The same components as those of FIG. 2 are denoted by the same reference numerals and their detailed descriptions are omitted.

The sixth embodiment differs from the first and second embodiments in the structure of the capacitor insulation films in capacitor sections A and B. The steps of processing the upper and lower electrodes and forming an interlayer insulation film, a contact, a wiring layer, etc. are the same as those in the first embodiment. The sixth embodiment will now be described with reference to FIG. 9.

As shown in FIG. 9, the capacitor insulation film in the capacitor section A includes a SiN film 14 having a thickness of 10 nm and an $Al_2O_3$ film 46 having a thickness of, e.g., 10 nm. The capacitor insulation film in the capacitor section B includes a $Ta_2O_5$ film 16 having a thickness of 20 nm and an $Al_2O_3$ film 46 having a thickness of 10 nm.

The configuration of the sixth embodiment can be achieved by executing the following step corresponding to that shown in FIG. 3A. An $Al_2O_3$ film 46 having a thickness of 10 nm is formed on the underlying electrode TiN film 13 and a SiN film 14 having a thickness of 10 nm is deposited on the entire surface of the resultant structure. After that, the SiN film 14 is removed from the capacitor section B by normal lithography and etching. Moreover, a $Ta_2O_5$ film 16 having a thickness of about 20 nm is formed on the entire surface and then removed from the capacitor section A by normal lithography and etching.

In the sixth embodiment, the number of steps is increased by the lithography and etching steps but the leakage current of the capacitor section B can be decreased more than that in the first embodiment.

The density of the MIM capacitor ($Al_2O_3$ film: 10 nm, $Ta_2O_5$ film: 20 nm, and SiN film: 10 nm) is as follows:
Capacitor section A (TiN/SiN/$Al_2O_3$/TiN): 3.62 fF/$\mu m^2$
Capacitor section B (TiN/$Ta_2O_5$/$Al_2O_3$/TiN): 4.53 fF/$\mu m^2$ For this reason, the capacitor section A can be used for a capacitor that decreases in leakage current and the capacitor section B can be used for a capacitor that increases in density.

Consequently, the same advantages as described in the above paragraphs (1) to (3) can be obtained from the sixth embodiment, too.

Seventh Embodiment

Figure 10:
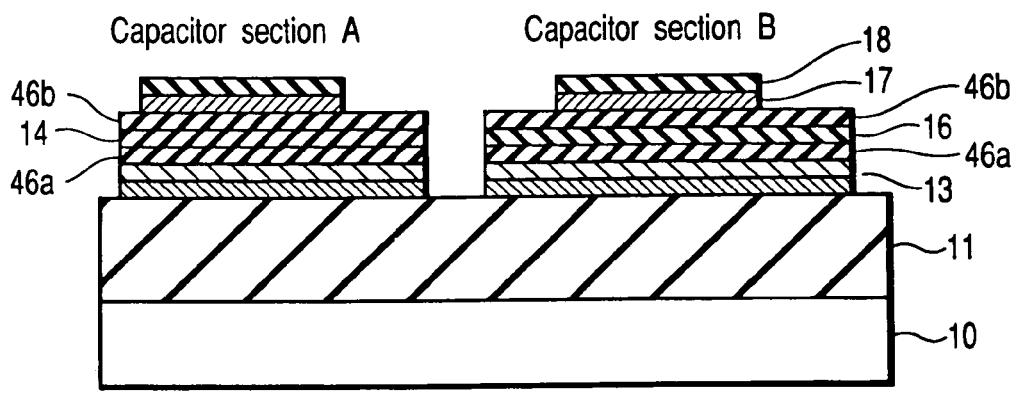
FIG. 10 is a schematic cross-sectional view of a configuration of a capacitor according to a seventh embodiment of the present invention.

FIG. 10 is a cross-sectional view schematically showing a configuration of upper and lower electrodes and that of capacitor insulation films in an MIM capacitor according to a seventh embodiment of the present invention. The same components as those of FIG. 2 are denoted by the same reference numerals and their detailed descriptions are omitted.

The seventh embodiment differs from the first and second embodiments in the structure of the capacitor insulation films in capacitor sections A and B. The steps of processing the upper and lower electrodes and forming an interlayer insulation film, a contact, a wiring layer, etc. are the same as those in the first embodiment. The seventh embodiment will now be described with reference to FIG. 10.

Referring to FIG. 10, the capacitor insulation film in the capacitor section A includes an $Al_2O_3$ film having a thickness of, e.g., 10 nm, a SiN film having a thickness of 10 nm, and an $Al_2O_3$ film (having a thickness of, e.g., 10 nm, while the capacitor insulation film in the capacitor section B includes an $Al_2O_3$ film having a thickness of, e.g., 10 nm, a $Ta_2O_5$ film having a thickness of 20 nm, and a $Al_2O_3$ film having a thickness of 10 nm.

The configuration of the seventh embodiment can be achieved by executing the following step corresponding to that shown in FIG. 3A. An $Al_2O_3$ film 46 having a thickness of 10 nm is formed on the underlying electrode TiN film 13 and a SiN film 14 having a thickness of 10 nm is deposited on the entire surface of the resultant structure. After that, the SiN film 14 is removed from the capacitor section B by normal lithography and etching. Moreover, a $Ta_2O_5$ film 16 having a thickness of about 20 nm is formed on the entire surface and then removed from the capacitor section A by normal lithography and etching. Subsequently, an $Al_2O_3$ film 46b having a thickness of about 10 nm is formed on the entire surface of the resultant structure, and a TiN film 17 serving as an upper electrode is formed thereon. After that, the lower electrode is processed and then the upper electrode is done as in the first embodiment.

In the seventh embodiment, the number of steps is increased by the lithography and etching steps but the leakage current of the capacitor section B can be decreased more than that in the first embodiment. Furthermore, the symmetry of the capacitor insulation films with regard to the upper and lower electrodes becomes good and improved at the time of application of a +/− bias.

The density of the MIM capacitor ($Al_2O_3$ film: 10 nm, $Ta_2O_5$ film: 20 nm, and SiN film: 10 nm) is as follows:

Capacitor section A (TiN/$Al_2O_3$/SiN/$Al_2O_3$/TiN): 2.49 fF/$\mu m^2$

Capacitor section B (TiN/$Al_2O_3$/$Ta_2O_5$/$Al_2O_3$/TiN): 2.93 fF/$\mu m^2$

Consequently, the capacitor section A can be used for a low-leakage-current capacitor that requires a low bias polarity dependence and the capacitor section B can be used for a high-density capacitor.

Not only the same advantages as those of the first embodiment can be obtained from the seventh embodiment, but also a capacitor having a low dependence of voltage on capacity can be achieved since the capacitor insulation films have a good symmetry with regard to the upper and lower electrodes. Moreover, the similarity (a so-called matching) in performance between adjacent capacitors can be improved by inserting an insulation film, which suppresses a reaction with the electrode that increases the variations in capacitor characteristics, between the electrode and the capacitor insulation film.

Eighth Embodiment

Figure 11:
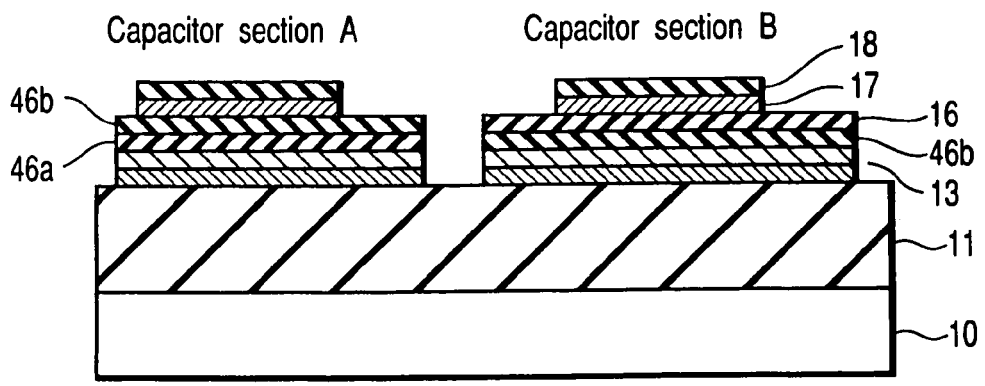
FIG. 11 is a schematic cross-sectional view of a configuration of a capacitor according to an eighth embodiment of the present invention.

FIG. 11 is a cross-sectional view schematically showing a configuration of upper and lower electrodes and that of capacitor insulation films in an MIM capacitor according to an eighth embodiment of the present invention. The same components as those of FIG. 2 are denoted by the same reference numerals and their detailed descriptions are omitted.

The eighth embodiment differs from the first and second embodiments in the structure of the capacitor insulation films in capacitor sections A and B. The steps of processing the upper and lower electrodes and forming an interlayer insulation film, a contact, a wiring layer, etc. are the same as those in the first embodiment. The eighth embodiment will now be described with reference to FIG. 11.

Referring to FIG. 11, the capacitor insulation film in the capacitor section A includes a two-layer $Al_2O_3$ film (an $Al_2O_3$ film having a thickness of, e.g., 10 nm and another $Al_2O_3$ film having a thickness of, e.g., 10 nm). The capacitor insulation film in the capacitor section B includes a $Ta_2O_5$ film having a thickness of 20 nm and an $Al_2O_3$ film B having a thickness of 10 nm. A process of manufacturing the MIM capacitor according to the eighth embodiment will be described below with reference to FIGS. 12A to 12C.

Figure 12A:
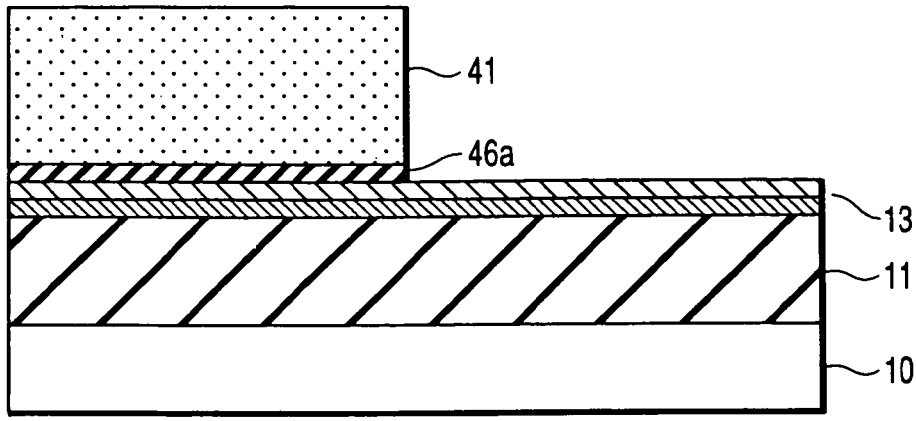
FIGS. 12A to 12C are cross-sectional views showing a process of manufacturing the capacitor according to the eighth embodiment.

As shown in FIG. 12A, an $Al_2O_3$ film 46a having a thickness of 10 nm is formed on the underlying electrode TiN film 13. After that, the $Al_2O_3$ film 46a is selectively removed by lithography and etching using a resist mask 41.

Figure 12B:
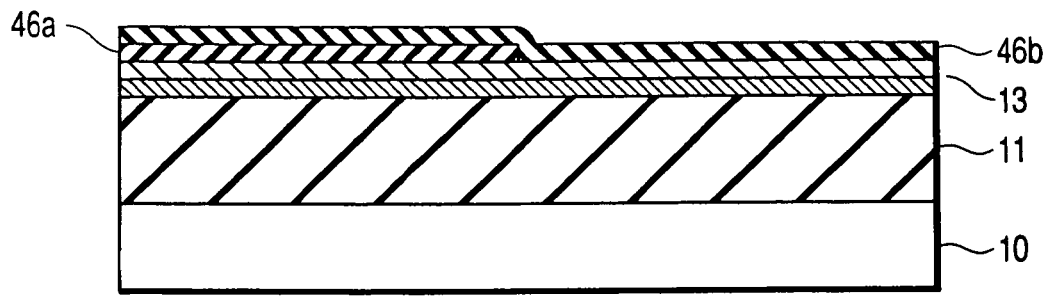

As illustrated in FIG. 12B, an $Al_2O_3$ film 46b having a thickness of about 10 nm is formed on the entire surface of the resultant structure. Thus, the capacitor section A includes a multilayer film of the $Al_2O_3$ films 46a and 46b, and the multilayer film has a thickness of 20 nm. This multilayer film can prevent a decrease in yield due to a pinhole or the like.

Figure 12C:
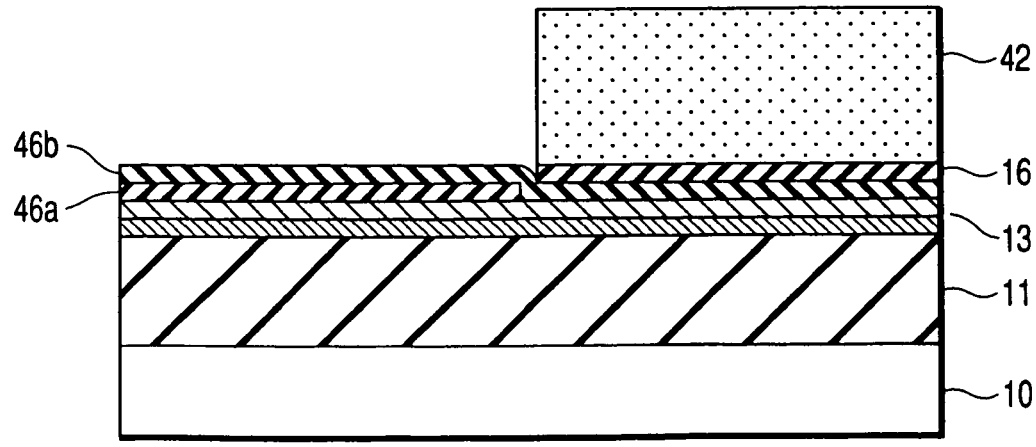

Referring to FIG. 12C, a $Ta_2O_5$ film 16 having a thickness of, e.g., 20 nm is formed on the entire surface of the resultant structure. Then, the $Ta_2O_5$ film 16 is selectively removed from the capacitor section A by normal lithography and etching using a resist mask 42. After that, an upper electrode TiN film 17 is formed on the entire surface of the resultant structure. Furthermore, a capacitor insulation film, a lower electrode and an upper electrode are processed as in the first embodiment, thereby achieving the MIM capacitor of the eighth embodiment.

In the eighth embodiment, the number of steps is increased by the lithography and etching steps but the leakage current of the capacitor section A can be decreased. At the same time, the leakage current of the capacitor section B is stabilized, and the characteristics of adjacent capacitors become identical with each other or the matching is improved.

The density of the MIM capacitor ($Al_2O_3$ film: 10 nm and $Ta_2O_5$ film: 20 nm) is as follows:

Capacitor section A (TiN/$Al_2O_3$/$Al_2O_3$/TiN): 3.98 fF/$\mu m^2$
Capacitor section B (TiN/$Ta_2O_5$/$Al_2O_3$/TiN): 4.63 fF/$\mu m^2$ Consequently, the capacitor section A can be used for a low-leakage-current capacitor and the capacitor section B can be used for a high-density capacitor.

If the above structure is thinned further, the density of the MIM capacitor ($Al_2O_3$ film: 5 nm and $Ta_2O_5$ film: 10 nm) is as follows:

Capacitor section A (TiN/$Al_2O_3$/$Al_2O_3$/TiN): 7.97 fF/$\mu m^2$
Capacitor section B (TiN/$Ta_2O_5$/$Al_2O_3$/TiN): 9.27 fF/$\mu m^2$ If the $Al_2O_3$ film can be thinned, the density of the MIM capacitor can be increased further while keeping a leakage current small. The $Al_2O_3$ film can be thinned using a technique of improving the quality of a thin film by ALD (atomic layer deposition).

Ninth Embodiment

Figure 13:
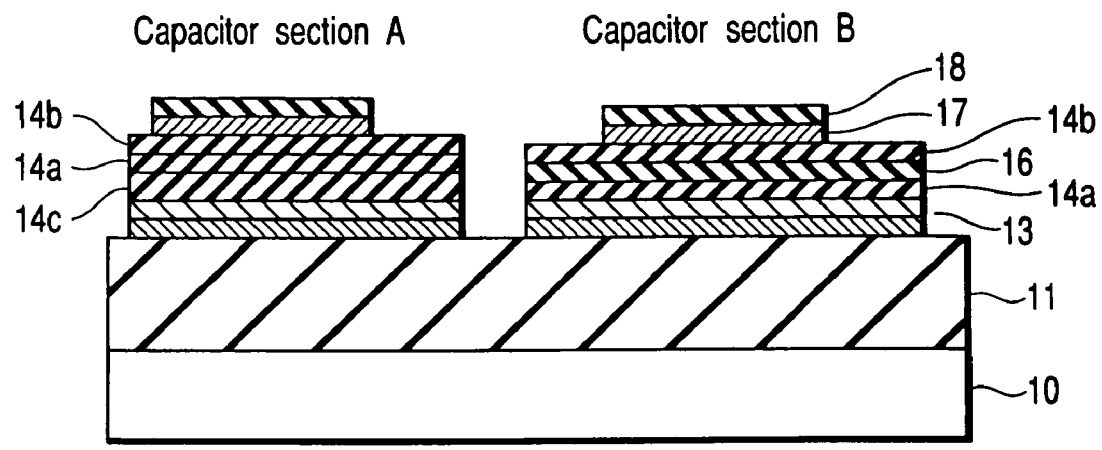
FIG. 13 is a schematic cross-sectional view of a configuration of a capacitor according to a ninth embodiment of the present invention.

FIG. 13 is a cross-sectional view schematically showing a configuration of upper and lower electrodes and that of capacitor insulation films in an MIM capacitor according to a ninth embodiment of the present invention. The same components as those of FIG. 2 are denoted by the same reference numerals and their detailed descriptions are omitted.

The ninth embodiment differs from the first embodiment in the structure of the capacitor insulation films in capacitor sections A and B. The steps of processing the upper and lower electrodes and forming an interlayer insulation film, a contact, a wiring layer, etc. are the same as those in the first embodiment. The ninth embodiment will now be described with reference to FIG. 13.

As illustrated in FIG. 13, the capacitor insulation film in the capacitor section A has a multilayer structure including a SiN film having a thickness of, e.g., 28 nm, a SiN film having a thickness of, e.g., 6 nm and a SiN film having a thickness of, e.g., 6 nm. The capacitor insulation film in the capacitor section B also has a multilayer structure including a SiN film having a thickness of, e.g., 6 nm, a $Ta_2O_5$ film having a thickness of, e.g., 20 nm and a SiN film having a thickness of, e.g., 6 nm.

Before the step shown in FIG. 3A in the first embodiment, a SiN film 14c having a thickness of 28 nm is formed on the entire surface of the structure and then removed from the section other than the capacitor section A. After that, a SiN film 14a having a thick-ness of 6 nm is formed as in the step shown in FIG. 3A and then a $Ta_2O_5$ film 16 is deposited on the entire surface of the resultant structure without removing the SiN film 14a. Subsequently, the $Ta_2O_5$ film 16 is removed from the capacitor section A by normal lithography and etching and a SiN film 14b having a thickness of 6 nm is deposited on the entire surface of the resultant structure. After that, an upper electrode TiN film 17 is formed on the entire surface of the resultant structure.

The MIM capacitor according to the ninth embodiment can be achieved by processing the capacitor insulation films and upper and lower electrodes in the same manner as that in the first embodiment. Since the SiN films 14a and 14b between which the $Ta_2O_5$ film is interposed are formed to prevent the $Ta_2O_5$ film 16 from reacting with the electrode TiN film, they have only to be thin. The thin SiN films 14a and 14b can be formed by, e.g., sputtering.

In the ninth embodiment, the number of steps is increased by the lithography and etching steps, but the leakage current of the capacitor section A can be decreased and the linearity of capacity-to-voltage can be improved. On the other hand, since the capacitor section B can be improved in the density per unit area ($fF/\mu m^2$), the capacitor forming area can be decreased.

The density of the MIM capacitor ($Ta_2O_5$ film: 20 nm and SiN film A+SiN film B+SiN film C: 40 nm) is as follows:

Capacitor section A (TiN/SiN(A)+SiN(B)+SiN(C)/TiN): 1.66 $fF/\mu m^2$

Capacitor section B (TiN/SiN(A)/$Ta_2O_5$/SiN(B)/TiN): 3.69 $fF/\mu m^2$

In the ninth embodiment, the $Ta_2O_5$ film is used as a high dielectric (high-K) film different from the SiN film. However, other high-K films having a great dielectric constant, such as a (Ba, Sr)$TiO_3$ film and a $SrTiO_3$ film can be used. The use of these films makes the density of the MIM capacitor higher.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device including a plurality of capacitors, comprising:
    forming a lower conductive film on a semiconductor substrate, the lower conductive film serving as a lower electrode;
    forming a capacitor insulation film on the lower conductive film, the capacitor insulation film including one of a single layer and a multilayer dielectric layer and varying in one of material and structure in different capacitor forming regions;
    forming an upper conductive film on the capacitor insulation film, the upper conductive film serving as an upper electrode;
    forming each of the lower electrodes of said plurality of the capacitors by etching the upper conductive film and the capacitor insulating film, then the lower conductive film into a lower electrode pattern; and
    forming each of the upper electrodes of said plurality of the capacitors by etching the upper conductive film into an upper electrode pattern,
    wherein said forming the capacitor insulation film includes forming a first capacitor insulation film on part of the lower conductive film, and forming a second capacitor insulation film on another part of the lower conductive film, the second capacitor insulation film being formed of a material different from the first capacitor insulation film.

2. The method according to claim 1, wherein the first capacitor insulation film is formed of a silicon nitride film and the second capacitor insulation film is formed of an oxide film which contains a tantalum.

3. A method of manufacturing a semiconductor device including a plurality of capacitors, comprising:
    forming a lower conductive film on a semiconductor substrate, the lower conductive film serving as a lower electrode;
    forming a capacitor insulation film on the lower conductive film, the capacitor insulation film including one of a single layer and a multilayer dielectric layer and varying in one of material and structure in different capacitor forming regions;
    forming an upper conductive film on the capacitor insulation film, the upper conductive film serving as an upper electrode;
    forming each of the lower electrodes of said plurality of the capacitors by etching the upper conductive film and the capacitor insulating film, then the lower conductive film into a lower electrode pattern; and
    forming each of the upper electrodes of said plurality of the capacitors by etching the upper conductive film into an upper electrode pattern,
    wherein said forming the capacitor insulation film includes forming a first capacitor insulation film on part of the lower conductive film, and forming a second capacitor insulation film on another part of the lower conductive film, the second capacitor insulation film being different from the first capacitor insulation film in layer structure.

4. The method according to claim 3, wherein the first capacitor insulation film is formed of a multilayer film including a silicon nitride film and a tantalum oxide film, and the second capacitor insulation film is formed of the tantalum oxide film.

5. The method according to claim 3, wherein the first capacitor insulation film is formed of a multilayer film including an aluminum oxide film and a silicon nitride film, and the second capacitor insulation film is formed of a multilayer film including the aluminum oxide film and a tantalum oxide film.

6. The method according to claim 3, wherein the first capacitor insulation film is formed of a multilayer film including a first aluminum oxide film, a silicon nitride film and a second aluminum oxide, and the second capacitor insulation film is formed of a multilayer film including the first aluminum oxide film, a tantalum oxide film and the second aluminum oxide.

7. The method according to claim 3, wherein the first capacitor insulation film is formed of an aluminum oxide film, and the second capacitor insulation film is formed of a multilayer film including the aluminum oxide film and a tantalum oxide film.

8. A method of manufacturing a semiconductor device including a plurality of capacitors, comprising:
    forming a lower conductive film on a semiconductor substrate, the lower conductive film serving as a lower electrode;

forming a capacitor insulation film on the lower conductive film, the capacitor insulation film including one of a single layer and a multilayer dielectric layer and varying in one of material and structure in different capacitor forming regions;

forming an upper conductive film on the capacitor insulation film, the upper conductive film serving as an upper electrode;

forming each of the lower electrodes of said plurality of the capacitors by etching the upper conductive film and the capacitor insulating film, then the lower conductive film into a lower electrode pattern; and forming each of the upper electrodes of said plurality of the capacitors by etching the upper conductive film into an upper electrode pattern, wherein said forming the capacitor insulation film includes:

forming a first capacitor insulation film on part of the lower conductive film;

forming a second capacitor insulation film on another part of the lower conductive film, said second capacitor insulation film being formed of a material different from the first capacitor insulation film; and forming a third capacitor insulation film on the other part of the lower conductive film, the third capacitor insulation film being formed by stacking the first and second capacitor insulation films.

9. The method according to claim 8, wherein said forming the capacitor insulation film includes:

forming a silicon nitride film on part of the lower conductive film;

forming a tantalum oxide film on another part of the lower conductive film; and forming a multilayer film including the silicon nitride film and the tantalum oxide film on the other part of the conductive film.

10. A method of manufacturing a semiconductor device including a plurality of capacitors, comprising:

forming a lower conductive film on a semiconductor substrate, the lower conductive film serving as a lower electrode;

forming a capacitor insulation film on the lower conductive film, the capacitor insulation film including one of a single layer and a multilayer dielectric layer and varying in one of material and structure in different capacitor forming regions;

forming an upper conductive film on the capacitor insulation film;

forming each of the upper electrodes of said plurality of the capacitors by etching the upper conductive film into an upper electrode pattern; and forming each of the lower electrodes of said plurality of the capacitors by etching the capacitor insulation film and then the lower conductive film into a lower electrode pattern, wherein said forming the capacitor insulation film includes forming a first capacitor insulation film on part of the lower conductive film, and forming a second capacitor insulation film on another part of the lower conductive film, the second capacitor insulation film being formed of a material different from the first capacitor insulation film.

11. The method according to claim 10, wherein the first capacitor insulation film is formed of a silicon nitride film and the second capacitor insulation film is formed of an oxide film which contains a tantalum.

12. A method of manufacturing a semiconductor device including a plurality of capacitors, comprising:

forming a lower conductive film on a semiconductor substrate, the lower conductive film serving as a lower electrode;

forming a capacitor insulation film on the lower conductive film, the capacitor insulation film including one of a single layer and a multilayer dielectric layer and varying in one of material and structure in different capacitor forming regions;

forming an upper conductive film on the capacitor insulation film;

forming each of the upper electrodes of said plurality of the capacitors by etching the upper conductive film into an upper electrode pattern; and forming each of the lower electrodes of said plurality of the capacitors by etching the capacitor insulation film and then the lower conductive film into a lower electrode pattern, wherein said forming the capacitor insulation film includes forming a first capacitor insulation film on part of the lower conductive film, and forming a second capacitor insulation film on another part of the lower conductive film, the second capacitor insulation film being different from the first capacitor insulation film in layer structure.

13. The method according to claim 12, wherein the first capacitor insulation film is formed of a multilayer film including a silicon nitride film and a tantalum oxide film, and the second capacitor insulation film is formed of the tantalum oxide film.

14. The method according to claim 12, wherein the first capacitor insulation film is formed of a multilayer film including an aluminum oxide film and a silicon nitride film, and the second capacitor insulation film is formed of a multilayer film including the aluminum oxide film and a tantalum oxide film.

15. The method according to claim 12, wherein the first capacitor insulation film is formed of a multilayer film including a first aluminum oxide film, a silicon nitride film and a second aluminum oxide, and the second capacitor insulation film is formed of a multilayer film including the first aluminum oxide film, a tantalum oxide film and the second aluminum oxide.

16. The method according to claim 12, wherein the first capacitor insulation film is formed of an aluminum oxide film, and the second capacitor insulation film is formed of a multilayer film including the aluminum oxide film and a tantalum oxide film.

17. A method of manufacturing a semiconductor device including a plurality of capacitors, comprising:

forming a lower conductive film on a semiconductor substrate, the lower conductive film serving as a lower electrode;

forming a capacitor insulation film on the lower conductive film, the capacitor insulation film including one of a single layer and a multilayer dielectric layer and varying in one of material and structure in different capacitor forming regions;

forming an upper conductive film on the capacitor insulation film;

forming each of the upper electrodes of said plurality of the capacitors by etching the upper conductive film into an upper electrode pattern; and forming each of the lower electrodes of said plurality of the capacitors by etching the capacitor insulation film and then the lower conductive film into a lower electrode pattern, wherein said forming the capacitor insulation film includes:

forming a first capacitor insulation film on part of the lower conductive film;

forming a second capacitor insulation film on another part of the lower conductive film, said second capacitor insulation film being formed of a material different from the first capacitor insulation film; and forming a third capacitor insulation film on the other part of the lower conductive film, the third capacitor insulation film being formed by stacking the first and second capacitor insulation films.

18. The method according to claim 17, wherein said forming the capacitor insulation film includes:

forming a silicon nitride film on part of the lower conductive film;

forming a tantalum oxide film on another part of the lower conductive film; and forming a multilayer film including the silicon nitride film and the tantalum oxide film on the other part of the conductive film.

* * * * *